United States Patent
Goto et al.

(10) Patent No.: US 6,836,165 B2
(45) Date of Patent: Dec. 28, 2004

(54) DLL CIRCUIT AND METHOD OF GENERATING TIMING SIGNALS

(75) Inventors: Keisuke Goto, Tokyo (JP); Sachiko Edo, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 09/826,179

(22) Filed: Apr. 4, 2001

(65) Prior Publication Data

US 2002/0021152 A1 Feb. 21, 2002

(30) Foreign Application Priority Data

Apr. 5, 2000 (JP) ........................................ 2000/103241

(51) Int. Cl.[7] .............................................. G06F 1/04
(52) U.S. Cl. ..................... 327/158; 327/392; 327/141; 327/161
(58) Field of Search ................................. 327/141, 158, 327/161, 291, 392, 293, 156, 295

(56) References Cited

U.S. PATENT DOCUMENTS

| | | | | |
|---|---|---|---|---|
| 5,642,082 A | * | 6/1997 | Jefferson | 331/25 |
| 5,717,353 A | * | 2/1998 | Fujimoto | 327/276 |
| 5,771,264 A | * | 6/1998 | Lane | 375/376 |
| 5,946,268 A | * | 8/1999 | Iwamoto et al. | 365/233 |
| 6,111,448 A | * | 8/2000 | Shibayama | 327/293 |
| 6,229,368 B1 | * | 5/2001 | Lee | 327/292 |
| 6,346,839 B1 | * | 2/2002 | Mnich | 327/158 |

FOREIGN PATENT DOCUMENTS

| | | |
|---|---|---|
| JP | H9-293374 | 11/1997 |
| JP | H10-254578 | 9/1998 |
| JP | H11-110062 | 4/1999 |
| JP | 11-261408 A | 9/1999 |
| JP | 2000196444 A * | 7/2000 |

* cited by examiner

*Primary Examiner*—Dinh T. Le
(74) *Attorney, Agent, or Firm*—Choate, Hall & Stewart

(57) ABSTRACT

A DLL circuit includes a delay circuit, a phase comparing circuit and a delay control circuit. The delay circuit is connected to first and second nodes, and delays an original clock signal supplied to the first node based on a delay control signal and generates first to n-th (n is an integer more than 1) internal clock signals. The first internal clock signal is outputted from the second node. Also, the internal clock signals other than the first internal clock signal are outputted from the delay circuit without passing through the second node, and lead the first internal clock signal in phase. The phase comparing circuit compares the original clock signal supplied from the first node and the first internal clock signal supplied from the second node, and outputs a phase difference of the original clock signal and the first internal clock signal. The delay control circuit outputs the delay control signal to the delay circuit based on the phase difference outputted from the phase comparing circuit.

17 Claims, 12 Drawing Sheets

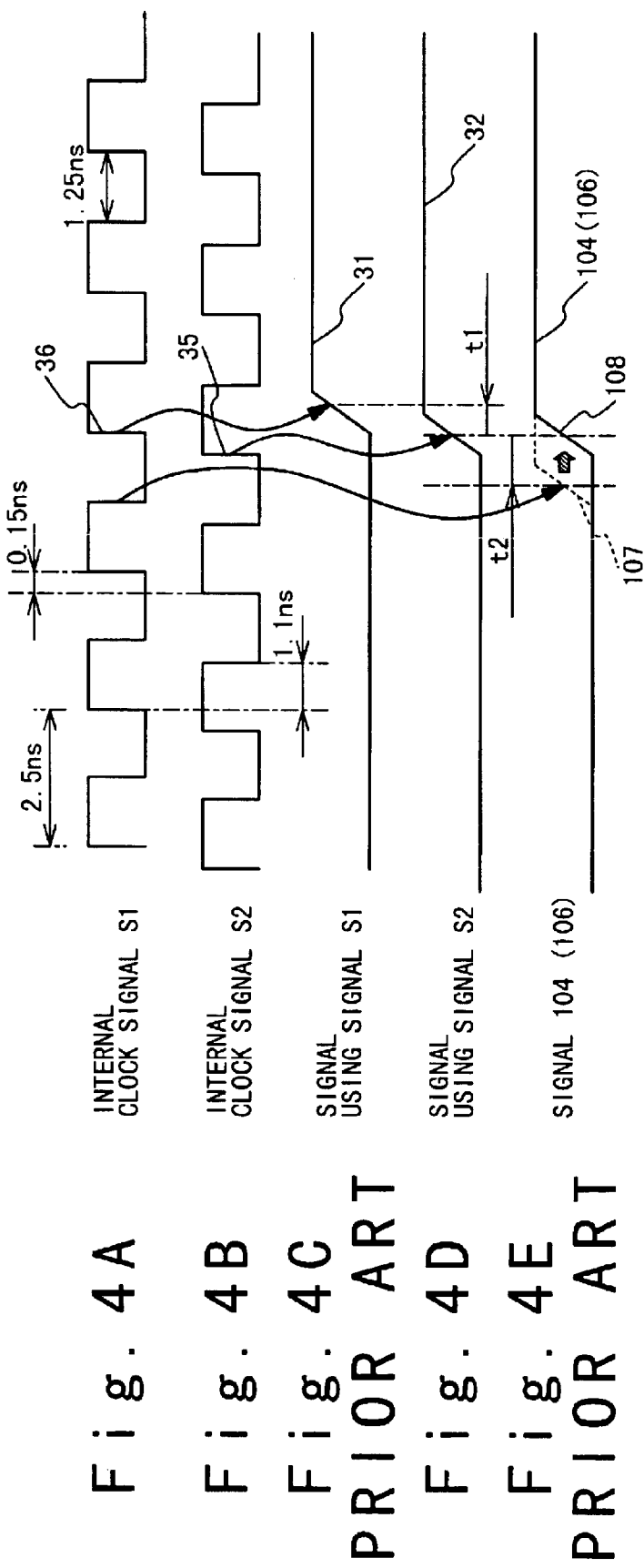

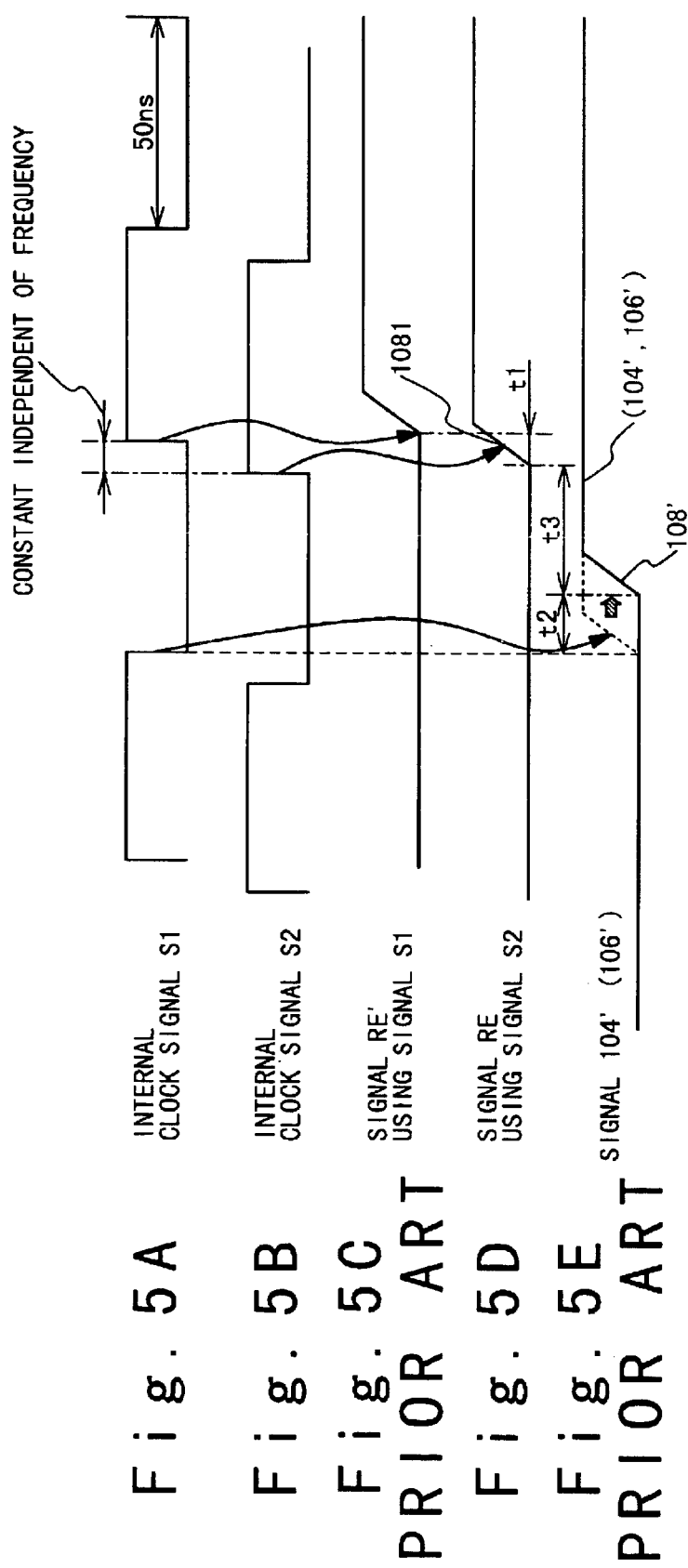

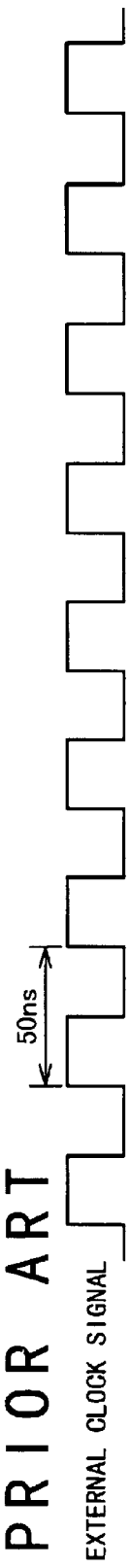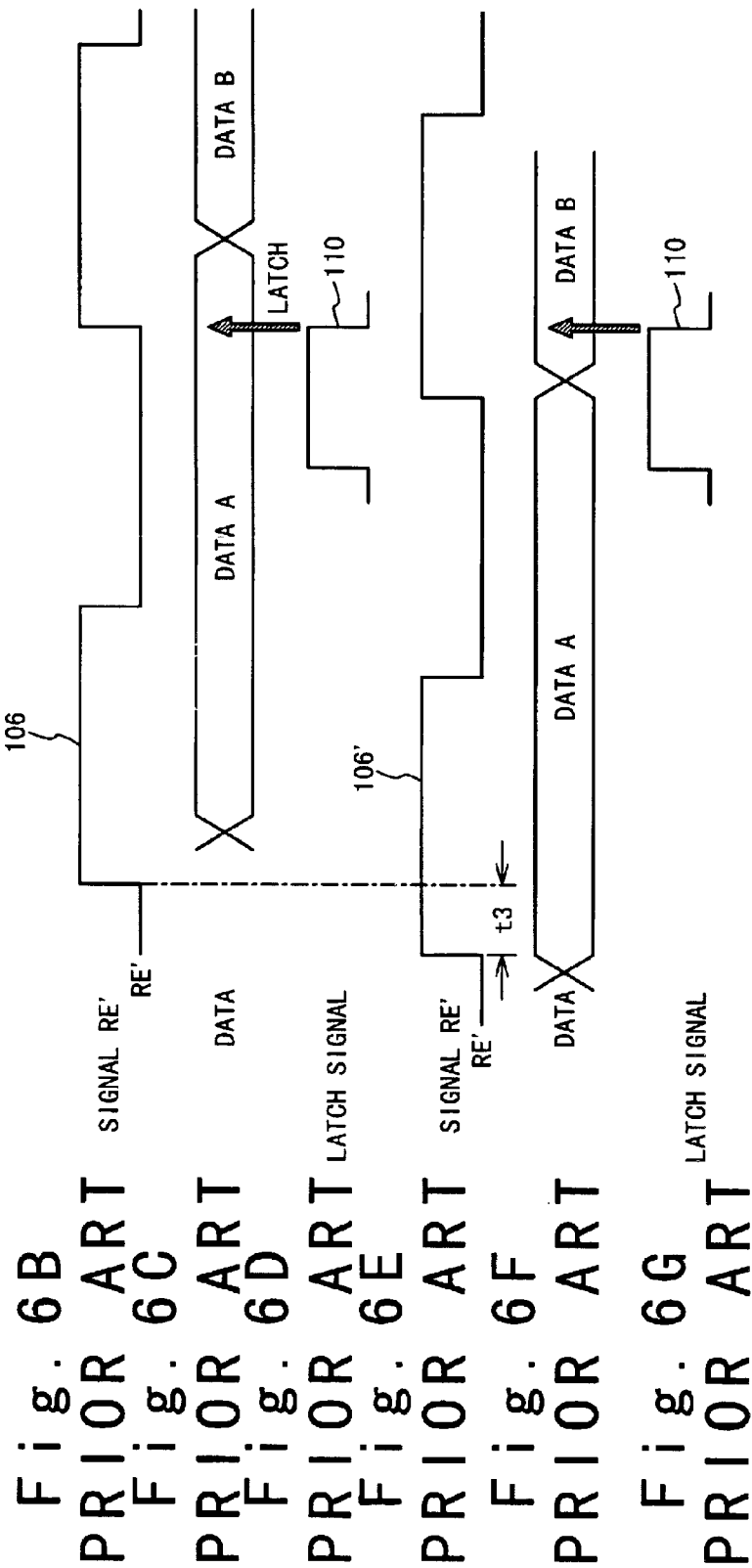

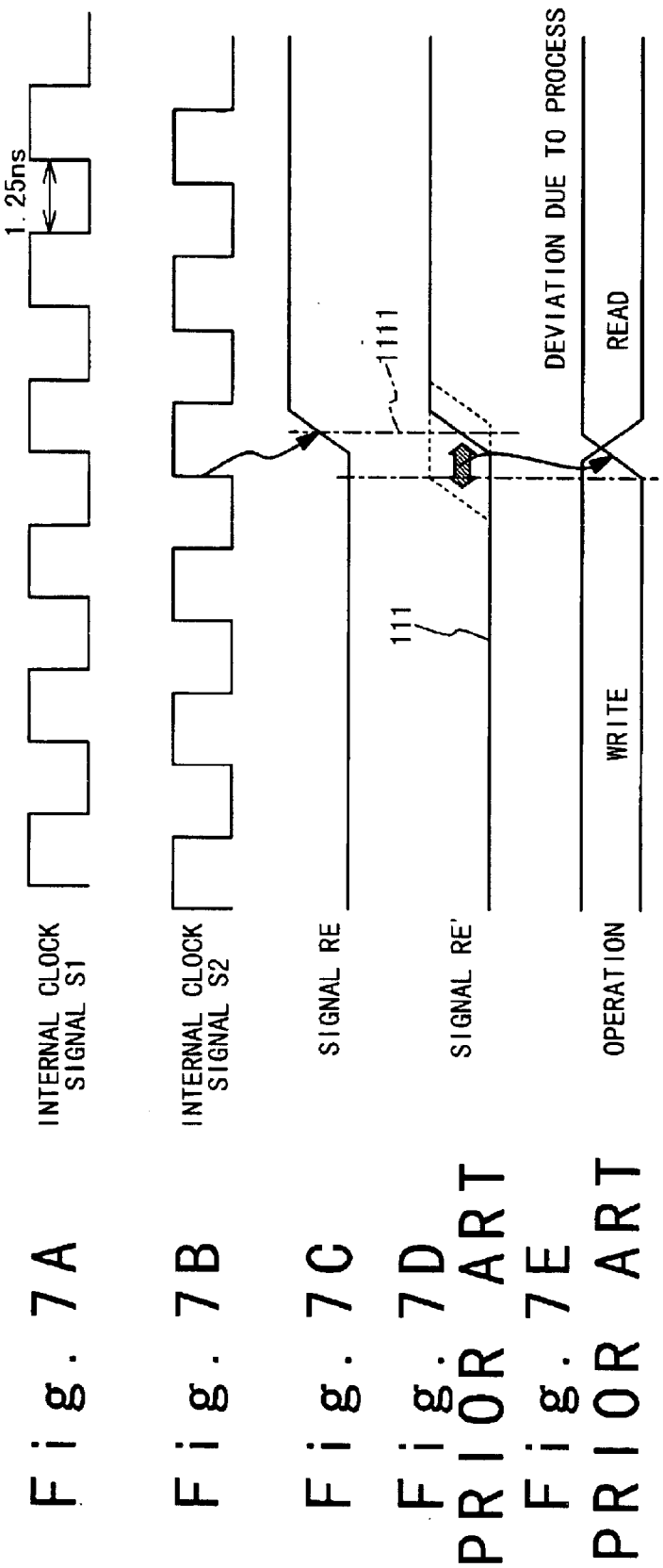

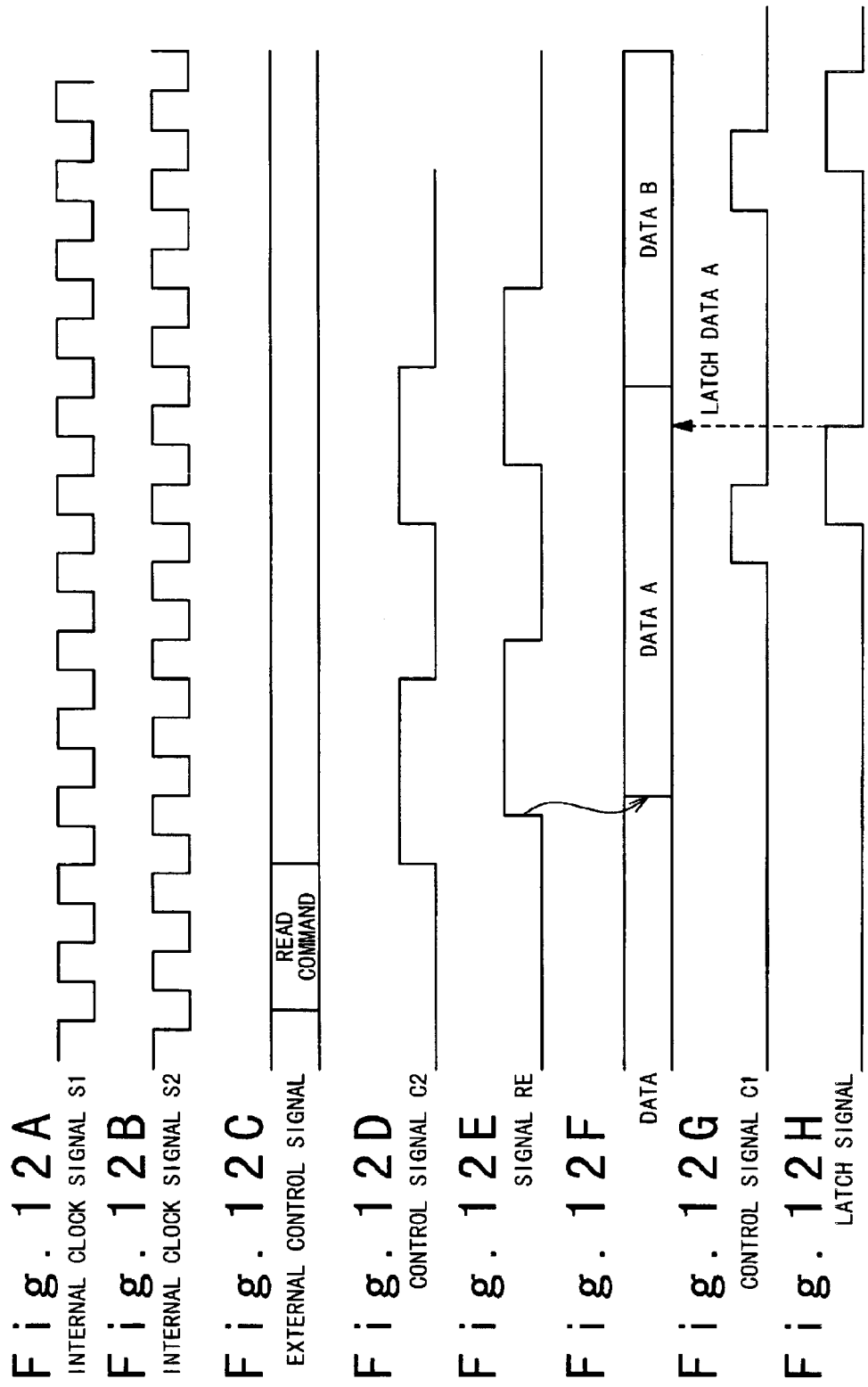

DLL CIRCUIT AND METHOD OF GENERATING TIMING SIGNALS

BACKGROUND OF THE INVENTION

1. Field of the Invention

The present invention relates to a DLL (delay locked loop) circuit, a semiconductor device using the same, and a method of generating timing signals.

2. Description of the Related Art

The operation of a semiconductor device such as a memory circuit, an interface circuit and a CPU are controlled based on a reference clock signal supplied from an external apparatus. In recent years, the memory circuit is required to operate correctly at a speed as high as about 400 MHz with increase of the operation speed of the semiconductor device. For example, a synchronous type DRAM carries out a data output in synchronism with the reference clock signal. Such a synchronous type DRAM needs to correctly operate in synchronism with a rising edge and a falling edge of the reference clock signal with about 2.5-ns period. In the other words, this is means that the synchronous type DRAM is necessary to operate at the timing of half period of 1.25 ns.

In the synchronous type DRAM, the operation is controlled based on internal clock signals which are generated based on the reference clock signal. However, in order to guarantee a correct high-speed operation, it is necessary that the phase of an external clock signal as a reference clock signal is coincident with that of the internal clock signal, or that the phase difference between the external clock signal and the internal clock signal is defined strictly. For the purpose of the coincidence in the phase, a DLL circuit is used.

That is, in the DLL circuit, a variable delay circuit delays the external clock signal such that the delayed signal is outputted as the internal clock signal. The phase of the internal clock signal generated thus is compared with the phase of the external clock signal by a phase comparing circuit, and a feedback phase control is carried out based on a phase deference to change the delay quantity of the variable delay circuit. In this way, the phase of the internal clock signal is coincident with the phase of the external clock signal.

Next, referring to FIG. 1, the structure of a conventional synchronous type DRAM as a first conventional example will be described. The first conventional example of the synchronous type DRAM is composed of a DLL circuit 201, a logic circuit 203, and a memory section 202. The logic circuit 203 is composed of a logic circuit 203-1 and flip-flop circuits 203-2 and 203-3. The memory section 202 is composed of a column control circuit 202-5, a memory array 202-1, a Y decoder (YDEC) 202-2, an I/O circuit 202-3, a latch circuit 202-4, a row control circuit 202-7, and an X decoder (XDEC) 202-6. Because the connection structure of the memory section 202 and the operation thereof are well known, the detailed description is omitted.

An internal clock signal S1 is outputted from the DLL circuit 201 based on an external clock signal. The internal clock signal S1 is supplied to an inversion clock terminal of the flip-flop circuit 203-2 and a clock terminal of the flip-flop circuit 203-3. The logic circuit 203-1 generates control signals C1 and C2 based on the external control signal. The control signal C1 is supplied to the flip-flop circuit 203-2, and the control signal C2 is supplied to the flip-flop circuit 203-3. The flip-flop circuit 203-3 outputs a read enable signal RE' to the column control circuit 202-5 of the memory section 202. Also, the flip-flop circuit 203-2 outputs a latch signal to the latch circuit 202-4 of the memory section 202.

Next, referring to FIGS. 2A to 2G, the operation of the synchronous type DRAM shown in FIG. 1 will be described. When a read command is supplied to the logic circuit 203-1 of FIG. 2B as an external control signal, the flip-flop circuit 203-3 generates the read enable signal of FIG. 2D based on the control signal C2 shown in FIG. 2C in synchronism with the internal clock signal S1. In this way, data A is read out from the memory section 202 as shown in FIG. 2E. The flip-flop circuit 203-2 generates the latch signal of FIG. 2G based on the control signal C1 of FIG. 2F in synchronism with the falling edge of the internal clock signal S1 of FIG. 2A. The data A is latched by the latch circuit 202-4 at the timing of the falling edge of the latch signal.

The synchronous type DRAM is composed of a section such as the I/O circuit 202-3 and the latch circuit 202-4 to carry out an operation in synchronism with the external clock signal, and a section to carry out an operation such as a read operation of data from the memory array in asynchronism with the external clock signal. This is constraint in case of the operation control of the synchronous type DRAM. That is, the timing of the synchronous operation is specified based on the standard of a product. Also, the timing of the asynchronous operation is determined based on the characteristics of transistors in the memory section and the delay due to inner wiring lines. Therefore, the latch circuit 202-4 cannot change the timing of the data output in accordance with the operation speed of the data read. Oppositely, the timing of the data read cannot be controlled from an external apparatus. Therefore, the rising timing of the read enable signal RE' shown in FIG. 2D needs to be adjusted to an optimal timing such that the latch signal is generated when data is read out from the memory array 202-1. In other words, the time period from the rising edge of the read enable signal RE' to the falling edge of the latch signal needs to be adjusted to the necessary and minimum time period for the correct data read operation.

For example, in the synchronous type DRAM, it is necessary to carry out a precharging operation of read lines immediately before the read operation. For this purpose, it is necessary to generate the second internal clock signal earlier than the internal clock signal synchronous with the external clock signal by a little time, e.g., by about 0.5 ns.

However, in the structure of FIG. 1, the read enable signal RE' synchronous with the internal clock signal S1 is used for the data read operation. Therefore, it is only possible to adjust the timing in units of periods or half periods of the external clock. As mentioned above, it is not possible to carry out strict timing adjustment in the time width shorter than the half period.

Also, FIG. 3 shows a second conventional example which uses a fixed delay circuit. Referring to FIG. 3, the second conventional example is composed of a DLL circuit 101, a latch circuit 102 and a fixed delay circuit 105. The DLL circuit 101 carries out delay control to an external clock signal Rclk and generates an internal clock signal 1011. The signal 1011 is supplied to the latch circuit 102. An activating signal 103 is supplied to the latch circuit 102. The latch circuit 102 outputs a signal 104 in response to the activating signal 103. The fixed delay circuit 105 delays the signal 104 and outputs a read enable signal RE' 106. The fixed delay circuit 105 is composed of a large number of delay elements and a total delay quantity of the delay elements is predetermined and fixed to the time t1. The signal RE' 106 delayed thus is used in an operation section of the synchronous type DRAM, e.g., the memory section. It is desired that the read enable signal RE' 106 leads a signal of FIG. 4C generated in response to the rising edge of the internal clock signal S1 by a time t1.

The operation of the second conventional example shown in FIG. 3 will be described. It is supposed that the internal clock signal S1 1011 shown in FIG. 4A is outputted from the DLL circuit 101. In this example, the external clock signal Rclk has a high frequency. Therefore, the internal clock signal S1 1011 also has a high frequency. When the signal 104 is outputted from the latch circuit 102 in response to the falling edge 36 of the internal clock signal S1 1011, the signal 104 has a rising edge 107, as shown in FIG. 4E. The dotted line of FIG. 4E shows the waveform at the rising edge of the signal 104. The timing of the rising edge 107 leads the desired timing by the time t2. The delay circuit 105 delays the signal 104 by the time t2 and outputs the delayed signal as the signal 106 having a rising edge 108. The signal 106 is shown by the solid line in FIG. 4E. The delay quantity of the delay circuit 105 is indicated as the time t2. In FIG. 4E, the desired timing is at the rising edge 108, and the second conventional example operates normally.

FIGS. 5A to 5E show waveforms in case where the frequency of the external clock signal Rclk is lower than that of the above-mentioned external clock signal. At this time, the internal clock signal S1 1011 also has the same low frequency as the external clock signal Rclk. The latch circuit 102 outputs the signal 104' in response to the falling edge of the internal clock signal S1 1011. The output signal of the latch circuit 102 in this case is shown in FIG. 5E by the dotted line as a signal 104'. The delay circuit 105 delays the signal 104' by the time t2 and outputs the delayed signal as a signal 106' having a rising edge 108'. The signal 106' is shown in FIG. 5E by the solid line.

As described above, the desired timing for the precharging operation is earlier than the rising edge of the internal clock signal S1 by the time t1. However, the delay quantity of the delay circuit 105 is fixed to the time t2. Therefore, the signal 106' is generated by delaying the signal 104' by the time t2 from the falling edge of the internal clock signal S1 1011. Therefore, the signal 106 can be outputted to have the rising edge at the desired timing when the frequency of the external clock signal is high. However, when the frequency of the external clock signal is low, the rising edge leads the desired timing by a time t3. This is because the delay quantity t2 of the delay circuit 105 is fixed and do not depend on the frequency of the internal clock signal. That is, when the signal 104 having a predetermined frequency is delayed so as to generate a signal having the rising edge at the desired timing, the signal may be delayed by a delay circuit. However, when the frequency of the signal 104 is low, the period becomes long. Also, when the frequency of the signal 104 is too high, the rising edge is later than the rising edge of the internal clock signal S1 1011. Therefore, if the signal 104 is delayed by the delay circuit 105 having the fixed delay quantity, the signal having the rising edge at the desired timing cannot be generated. In this way, the operation in the low frequency cannot be guaranteed in the second conventional example.

The second conventional example has another problem in a data read operation of the synchronous type DRAM when the external clock Rclk of FIG. 6A has a low frequency. FIGS. 6B, 6C and 6D show an expected normal operation, and FIGS. 6E, 6F and 6G show an erroneous operation. Here, the timing of the data latch is externally set based on the number of pulses of the external clock signal Rclk.

In case of the normal operation, a read enable signal RE' 106 of the FIG. 6B is generated to have a rising edge earlier by a predetermined time than the rising edge of the external clock Rclk shown in FIG. 6A. The read operation is started in response to the earlier read enable signal RE' 106. In this case, data A can be latched right at the timing of the falling edge of a latch signal 110.

On the other hand, as described above with reference to FIG. 5E, the signal 106' is generated earlier by the time t3 than the desired timing. In this case, the read enable signal 106' rises up earlier than the desired timing, as shown in FIG. 6E, so that the read operation is started earlier by the time t3 than the desired timing. The timing of the read operation is determined based on the structure of the memory section and is approximately constant. Therefore, the data is early read out from the memory section. On the other hand, the latch timing of the data is previously determined in relation to the number of pulses of the external clock signal Rclk such that the read out data is latched at the falling edge of the latch signal 110. Therefore, when the read operation is started earlier than the desired timing, the read operation ends earlier. As a result, the read data A which should be latched originally cannot be latched. An erroneous operation is carried out that the latching operation is carried out during the following operation, e.g., a read operation of data B in this example. Thus, the data B is latched at the falling edge of the latch signal 110. Such an erroneous operation is easy to occur as the frequency of the clock signal is decreased.

Also, the deviation of characteristic is caused dependent on a manufacturing process of the delay elements of the delay circuit in case of the delay elements with fixed delay quantity. The erroneous operation due to the characteristic deviation of delay elements in the manufacturing process will be described. Especially, when a large number of delay elements are used as shown in FIG. 3, this problem is severe.

The read enable signal RE' 111 shown in FIG. 7E is shifted from the desired timing 1111 in a preceding or delaying direction due to physical deviation of the delay elements in the manufacturing process. For example, when the rising timing of the signal 111 is shifted to the timing later than the desired timing, the read operation is late so that the high-speed read operation cannot be achieved. Therefore, the problem on throughput occurs. Also, when the rising timing of the signal 111 is shifted to the timing earlier than the desired timing, the read enable signal RE' 111 of FIG. 7D rises up before a write operation end, as shown in FIG. 7E. As a result, there is a possibility that the write operation and the read operation overlap so that the erroneous operation is carried out.

FIGS. 8A to 8C show the switching of the operation. FIG. 8B shows an erroneous operation and FIG. 8C shows a normal operation. It should be noted that the dotted line of FIG. 8B shows the timing of the normal operation. As shown in FIG. 8C, in the normal operation, a read operation is started after a write operation is ended. On the other hand, when the delay elements are deviated so that the delay times are deviated, a read enable signal is early generated so that the read operation is started before the write operation is ended. In this way, when the timing signals are generated using many delay elements, the normal operation is difficult to be guaranteed because of the deviation of the delay quantities of the delay elements.

On the other hand, there is a case that the half period of the clock signal is 1.25 ns for the high speed operation of the memory device. The desired timing in this case is at a rising edge 115' earlier by about 0.15 ns than the rising edge 115 of the clock signal shown in FIG. 8A. Therefore, in the high speed memory device, it is necessary to generate the signal having a very short time difference correctly. The signal having such a short time difference needs be generated in consideration of manufacturing deviation of the memory device.

Also, there are a case that the frequency of the clock signal is changed by the user and a case that a system test is carried out using a low frequency clock signal by a manufacturer or the user. When a phase leading clock signal is generated by delaying an original clock signal by a delay circuit with a fixed delay quantity, data is outputted earlier as described above.

A conventional DLL circuit is disclosed in Japanese Laid Open Patent Application (JP-A-Heisei 11-261408: the third conventional example) as shown in FIG. 9. In this conventional DLL circuit, an intermediate output of a variable delay section 311 is taken out. Therefore, because the phase leading quantity to the final output has frequency dependence, an erroneous operation is caused as in the second conventional example. For example, it is supposed that a signal with the phase proceeding by ¼ of one cycle from the last output is generated as the intermediate output. In this case, when the clock signal has a low frequency, the intermediate output is outputted at the timing earlier too much than the desired timing.

Moreover, in the semiconductor device, it is necessary to realize the circuit which generates the signal having a desired earlier timing in a small size.

SUMMARY OF THE INVENTION

Therefore, an object of the present invention is to provide a DLL circuit which can generate a clock signal with a predetermined preceding phase (an earlier clock signal) to an output signal without dependence on a used frequency.

Also, another object of the present invention is to provide a DLL circuit which can generate the earlier clock signal in a small circuit size.

Also, another object of the present invention is to a DLL circuit which can easily generate a plurality of earlier clock signals.

Also, another object of the present invention is to provide a semiconductor device such as a synchronous type DRAM having the above-mentioned DLL circuit.

In an aspect of the present invention, a DLL circuit includes a delay circuit, a phase comparing circuit and a delay control circuit. The delay circuit is connected to first and second nodes, and delays an original clock signal supplied to the first node based on a delay control signal and generates first to n-th (n is an integer more than 1) internal clock signals. The first internal clock signal is outputted from the second node. Also, the internal clock signals other than the first internal clock signal are outputted from the delay circuit without passing through the second node, and lead the first internal clock signal in phase. The phase comparing circuit compares the original clock signal supplied from the first node and the first internal clock signal supplied from the second node, and outputs a phase difference of the original clock signal and the first internal clock signal. The delay control circuit outputs the delay control signal to the delay circuit based on the phase difference outputted from the phase comparing circuit.

The delay circuit may include first and second delay circuits. The first delay section delays the original clock signal based on the delay control signal to generate a first delay signal. The second delay section is provided between the second node and the first delay section. The second delay section delays the first delay signal to generate the first to n-th internal clock signals, and outputs the first internal clock signal from the second node, and the internal clock signals other than the first internal clock signal without passing through the second node.

In this case, the second delay circuit may include a plurality of delay elements connected in series, and the first to n-th internal clock signals are outputted from different ones of the plurality of delay elements. In this case, the plurality of delay elements may have substantively a same delay quantity, or have delay quantities different from each other.

Also, the delay quantity of each of the plurality of delay elements may be predetermined, and it is desired that the delay quantity of each of the plurality of delay elements is independent of a frequency of the original clock signal.

Also, each of the plurality of delay elements may be one of an inverter and a buffer, and the number of delay elements may be n.

In another aspect of the present invention, a semiconductor memory device includes a DLL (delay locked loop) circuit, first and second flip-flops and a memory section. The DLL circuit is connected to a node and delays an external clock signal to generate first and second internal clock signals. The first internal clock signal is outputted through the node, the second internal clock signal leads the first internal clock signal by a predetermined phase value. The first flip-flop generates a latch signal in response to the first internal clock signal. The second flip-flop generates a read enable signal in response to the second internal clock signal. The memory section includes a memory cell array, and prepares a read operation of data from the memory cell array in response to the read enable signal and latches the data in response to the latch signal.

It is desired that the predetermined phase value corresponds to a time of precharging read lines associated with the read operation of the data.

Also, the DLL circuit may include a delay circuit is connected to the node, and delays the external clock signal based on a delay control signal and generates the first and second internal clock signals. The second internal clock signal is outputted without passing through the node. The phase comparing circuit compares the external clock signal supplied and the first internal clock signal, and outputs a phase difference of the external clock signal and the first internal clock signal. The delay control circuit outputs the delay control signal to the delay circuit based on the phase difference outputted from the phase comparing circuit.

In this case, the delay circuit may include a first delay section delays the external clock signal based on the delay control signal to generate a first delay signal; and a second delay section which is connected to the node and delays the first delay signal to generate the first and second internal clock signals. the second delay circuit may include a plurality of delay elements connected in series, and the first and second internal clock signals are outputted from different ones of the plurality of delay elements, respectively.

In this case, it is desired that the delay quantity of each of the plurality of delay elements is independent of a frequency of the external clock signal. Also, the delay quantity of each of the plurality of delay elements may be predetermined.

In still another aspect of the present invention, a method of generating timing signals, may be attained by (a) delaying an original clock signal supplied to a first node based on a delay control signal; by (b) generating first to n-th (n is an integer more than 1) internal clock signals from the delayed original clock signal, wherein the first internal clock signal is outputted from a second node, and the internal clock signals other than the first internal clock signal are outputted without passing through the second node, and lead the first internal clock signal in phase by a predetermined value; by (c) detecting a phase difference between the original clock signal and the first internal clock signal; and by (d) generating the delay control signal based on the detected phase difference.

The (a) delaying step may be attained by (e) delaying the original clock signal based on the delay control signal to generate a first delay signal, and by (f) delaying the first delay signal to generate the first to n-th internal clock signals.

In this case, the (f) delaying step may include the step of (g) delaying the first delay signal by a plurality of delay elements connected in series, wherein the first to n-th internal clock signals are outputted from different ones of the plurality of delay elements. The plurality of delay elements may have substantively a same delay quantity or have delay quantities different from each other.

Also, the delay quantity of each of the plurality of delay elements may be predetermined. In addition, the delay quantity of each of the plurality of delay elements may be independent of a frequency of the original clock signal.

BRIEF DESCRIPTION OF THE DRAWINGS

FIGS. 4A to 4E are timing charts showing the comparison between the present invention and the conventional example when a clock signal has a high frequency;

FIGS. 5A to 5E are timing charts showing the comparison between the present invention and the conventional example when the clock signal has a low frequency;

FIGS. 6A to 6G are timing charts showing the operation of the semiconductor device of FIG. 3 when the clock signal has a low frequency;

FIGS. 7A to 7E are timing charts showing the comparison between the present invention and the conventional example in deviation of the characteristic of the delay element;

FIGS. 12A to 12H are timing charts showing the operation of the semiconductor device of FIG. 10.

DESCRIPTION OF THE PREFERRED EMBODIMENTS

Hereinafter, a semiconductor device such as a synchronous type DRAM having a DLL circuit of the present invention will be described below in detail with reference to the attached drawings.

Figure 10:
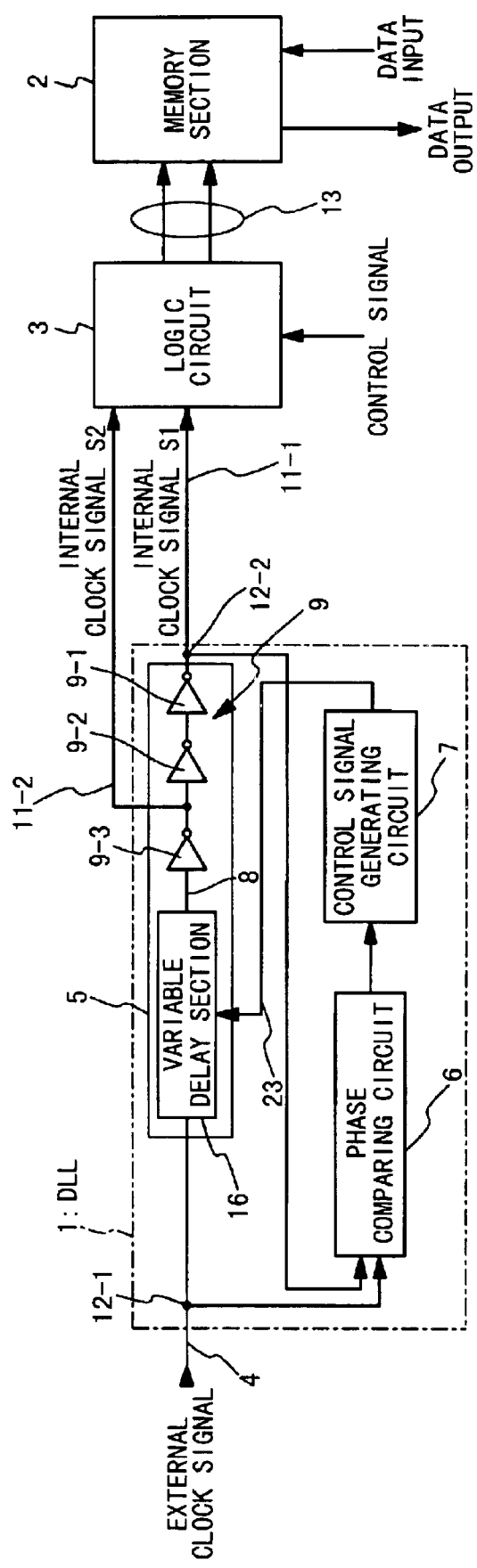
FIG. 10 is a block diagram showing the structure of a semiconductor device having a DLL circuit according to a first embodiment of the present invention.

FIG. 10 is a block diagram showing the structure of the semiconductor device according to the first embodiment of the present invention. Referring to FIG. 10, the semiconductor device is composed of a DLL circuit 1, a memory section 2 and a logic circuit 3. The DLL circuit 1 is composed of a delay circuit 5, a phase comparing circuit 6 and a control signal generating circuit 7. The delay circuit 5 is provided between a node 12-1 and a node 12-2 and is composed of a variable delay section 16 and a fixed delay section 9.

The fixed delay section 9 is composed of k delay elements 9-1, 9-2, . . . , 9-k (k is an integer more than 1) connected in series and having a fixed delay quantity. Each delay element may be a buffer or an inverter. In FIG. 10, the delay element is shown as the inverter. Also, an internal clock signal may be taken out from the output of each delay element of the fixed delay section 9 or from an optional delay element. In this example, three delay elements are used and two internal clock signals are outputted. One of the two internal clock signals is an internal clock signal S1 11-1 and is an output of the last delay element of the fixed delay section 9. Also, an internal clock signal S2 11-2 is the output of the third delay element of the fixed delay section 9 from the last delay element. That is, the internal clock signal S2 11-2 has a preceding phase corresponding to the delay times of the delay elements 9-1 and 9-2 than the internal clock signal S1 11-1.

An external clock signal 4 is supplied to the delay circuit 5 and the phase comparing circuit 6. The external clock signal 4 is delayed by the variable delay section 16 of the delay circuit 5 based on a control signal and is further delayed by the fixed delay section 9. The variable delay section 16 has a delay quantity which depends on the frequency of the clock signal. Also, the fixed delay section 9 has a delay quantity which is not dependent on the frequency of the clock signal, or is independent of the frequency of the clock signal.

The output of the delay circuit 5, i.e., the internal clock signal S1 11-1 is supplied to the phase comparing circuit 6. The phase comparing circuit 6 compares the phase of the external clock signal 4 and the phase of the internal clock signal S1 11-1 and outputs the phase difference to the control signal generating circuit 7. The control signal generating circuit 7 generates a delay control signal 23 based on the phase difference and outputs it to the variable delay section 16 of the delay circuit 5. In this way, the variable delay section 16 delays the external clock signal 4 based on the delay control signal 23. As the result, the phase of the internal clock signal S1 11-1 is coincident with the phase of the external clock signal 4.

The logic circuit 3 generates access control signals 13 from the internal clock signal S1 11-1 and the internal clock signal S2 11-2 and outputs them to the memory section 2. In this way, data is read out from the memory section 2.

Figure 11:
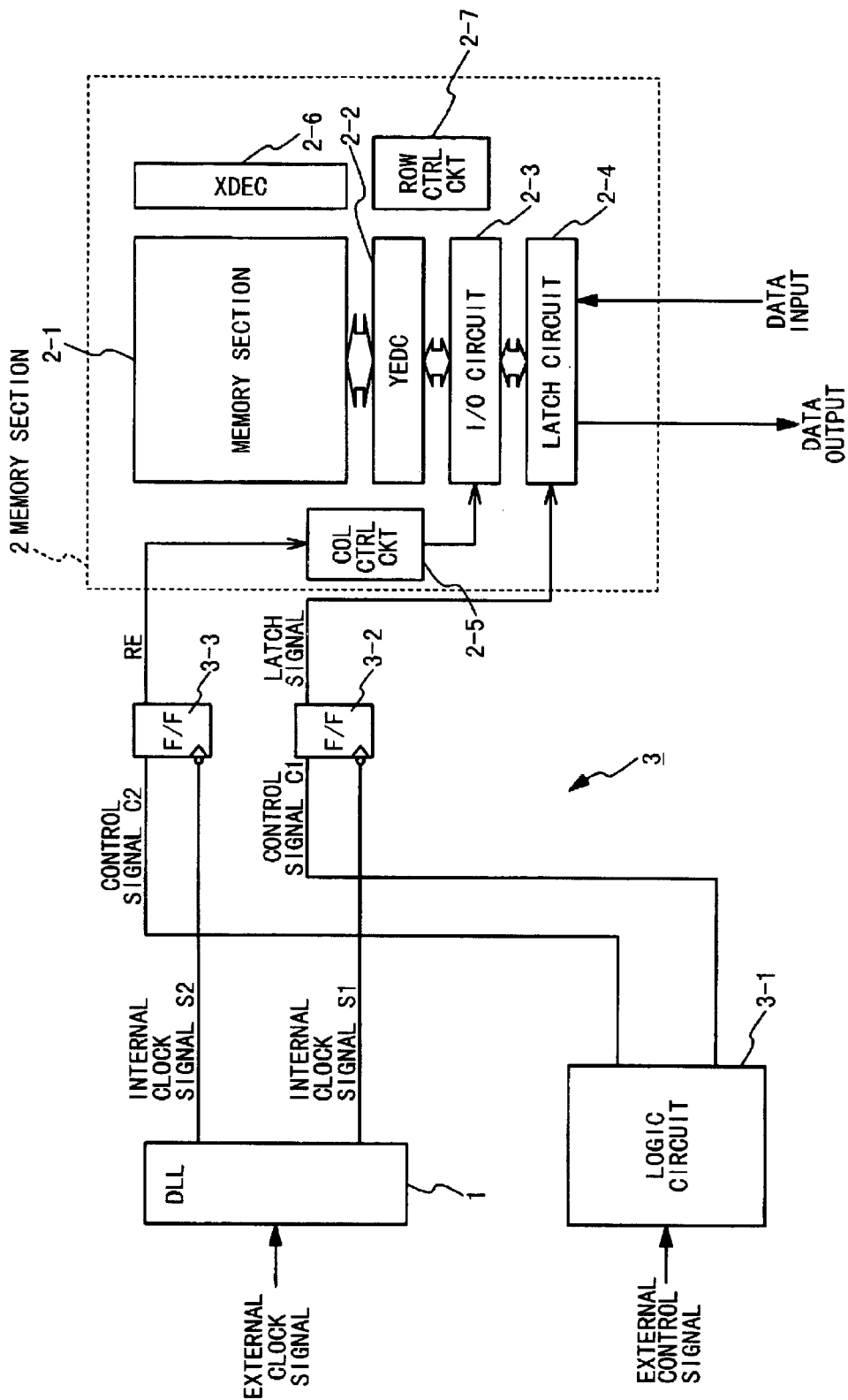
FIG. 11 is a block diagram showing the detail of a logic circuit and a memory section of FIG. 10.

FIG. 11 is a block diagram showing the detail of the logic circuit 3 and memory section 2. Referring to FIG. 11, the structure of the synchronous type DRAM of the present invention will be described. The synchronous type DRAM is composed of the DLL circuit 1, a logic circuit 3, and a memory section 2, as described above. The logic circuit 3 is composed of a logic circuit 3-1 and flip-flop circuits 3-2 and 3-3. The memory section 2 is composed of a column control circuit 2-5, a memory array 2-1, a Y decoder (YDEC) 2-2, an I/O circuit 2-3, a latch circuit 2-4, a row control circuit 2-7, and an X decoder (XDEC) 2-6. Because the structure of the memory section 2 is conventionally known, the description is omitted.

The internal clock signal S1 11-1 and the internal clock signal S2 11-2 are outputted from the DLL circuit 1. The internal clock signal S1 11-1 is supplied to the inversion clock terminal of the flip-flop circuit 3-2. The internal clock signal S2 11-2 is supplied to the clock terminal of the flip-flop circuit 3-3. The logic circuit 3-1 generates control signals C1 and C2 in response to a control signal. The control signal C1 is supplied to the flip-flop circuit 3-2, and the control signal C2 is supplied to the flip-flop circuit 3-3. The flip-flop circuit 3-3 outputs a read enable signal RE to the column control circuit of the memory section 2 in response to the control signal C2 and the internal clock signal S2. Also, the flip-flop circuit 3-2 outputs a latch signal to the latch circuit of the memory section 2 in response to the control signal C1 and the internal clock signal S1.

Next, referring to FIGS. 12A to 12H, the operation of the synchronous type DRAM shown in FIG. 11 will be described. FIGS. 12A and 12B show the waveforms of the internal clock signal S1 11-1 and the internal clock signal S2 11-2, respectively. In this example, the phase of the internal clock signal S2 11-2 has a preceding phase by a light bit by two inverters (delay elements) of the fixed delay section 9 than the internal clock signal S1 11-1.

When the read command of FIG. 12C is supplied to the logic circuit 3-1 as the control signal, the logic circuit 3-1 generates and outputs the control signal C1 of FIG. 12G and the control signal C2 of FIG. 12D to the flip-flop circuits 3-2 and 3-3, respectively. The flip-flop circuit 3-3 generates the read enable signal RE of FIG. 12E based on the control signal C2 shown in FIG. 12D in synchronism with the internal clock signal S2 11-2. In this way, the read enable signal RE is outputted to the memory section 2 prior to the read operation which is defined by the internal clock signal S1 11-1. As a result, data can be read out from the memory section 2 at high speed as shown in FIG. 12F.

The flip-flop circuit 3-2 generates the latch signal of FIG. 12H based on the control signal C1 of FIG. 12G in synchronism with the falling edge of the internal clock signal S2 11-2 of FIG. 12B. The data A is read out from the memory section 2 and is latched at the timing of the falling edge of the latch signal so that the data can be outputted.

As mentioned above, the delay quantity of the fixed delay section 9 do not depend on the frequency of the external clock signal and is peculiarly set based on the delay elements of the fixed delay section 9. That is, the delay quantity of the fixed delay section 9 is independent from the frequency of the external clock signal 4.

Also, the internal clock signal S1 11-1 is outputted from the fixed the delay circuit 9 of the delay circuit 5 and also defines the operation of the memory section 2. The internal clock signal S2 11-2 has the delay quantity less by a predetermined delay quantity than the internal clock signal S1 11-1 as a reference signal. That is, the internal clock signal S2 11-2 has a preceding phase than the internal clock signal S1 11-1 as the reference signal. In order to make such a phase relation possible, the fixed delay section 9 has a multi-stage structure to secure a delay quantity.

It is supposed that the fixed delay section 9 is composed of the inverters of 3 stages as shown in FIG. 10. If the delay quantity of the delay element (inverter) of each stage is $\Delta L$, all the delay quantities of the inverters of the n stages connected in series is about $n*\Delta L$. If the delay quantity L of the inverter of 1 stage is 0.15/2 ns, the internal clock signal S2 11-2 outputted from the inverter 9-3 of the first stage has the preceding phase than the internal clock signal S1 11-1 by about 0.15 ns. If the read enable signal RE is generated using the phase preceding signal, the synchronous type DRAM can carry out a high-speed operation stably. It should be noted that it is supposed that the delay quantities of all the inverters as delay elements are equal. However, the delay quantities of all the inverters as delay elements 9-1 to 9-3 may be different from each other. Also, each delay element is not an inverter and may be a buffer.

FIGS. 4A and 4B show the internal clock signal S1 11-1 and the internal clock signal S2 11-2. The internal clock signal S2 11-2 has a preceding phase by about 0.15 ns than the internal clock signal S1 11-1. Also, the period of the internal clock signal S1 11-1 is 2.5 ns. The read enable signal RE of the FIG. 4D is generated based on the rising edge of the internal clock signal S2 11-2 and has the preceding phase earlier by the time t1 than the read enable signal of FIG. 4C which is generated based on the internal clock signal S1 11-1. Here, the time t1 is roughly 0.15 ns. The time t1 is peculiar to the inverters 9-1 and 9-2 and do not depend on the frequency of the internal clock signal S1 11-1 and the internal clock signal S2 11-2. Therefore, the time t1 does not depend on the frequency of the external clock signal 4. Even if the frequency of the internal clock signal S1 11-1 or the internal clock signal S2 11-2 becomes low as shown in FIG. 5A, the time t1 is invariable as shown in FIG. 5D.

The j-th inverter 9-j can be selected such that the delay quantity of the internal clock signal S2 11-2 is within an allowable range, in consideration of deviation of the delay quantities of the respective delay elements of the fixed delay section 9. After the j-th delay element is selected once, the time t1 is invariable. Therefore, any erroneous operation occurs no longer unlike the conventional example as shown in FIG. 5E. In this way, the internal clock signal S2 11-2 can be outputted earlier by a total delay time (=t1) of the delay elements from the last delay element to the j-th delay element of the fixed delay section 9, even if the operation frequency changes.

Figure 1:
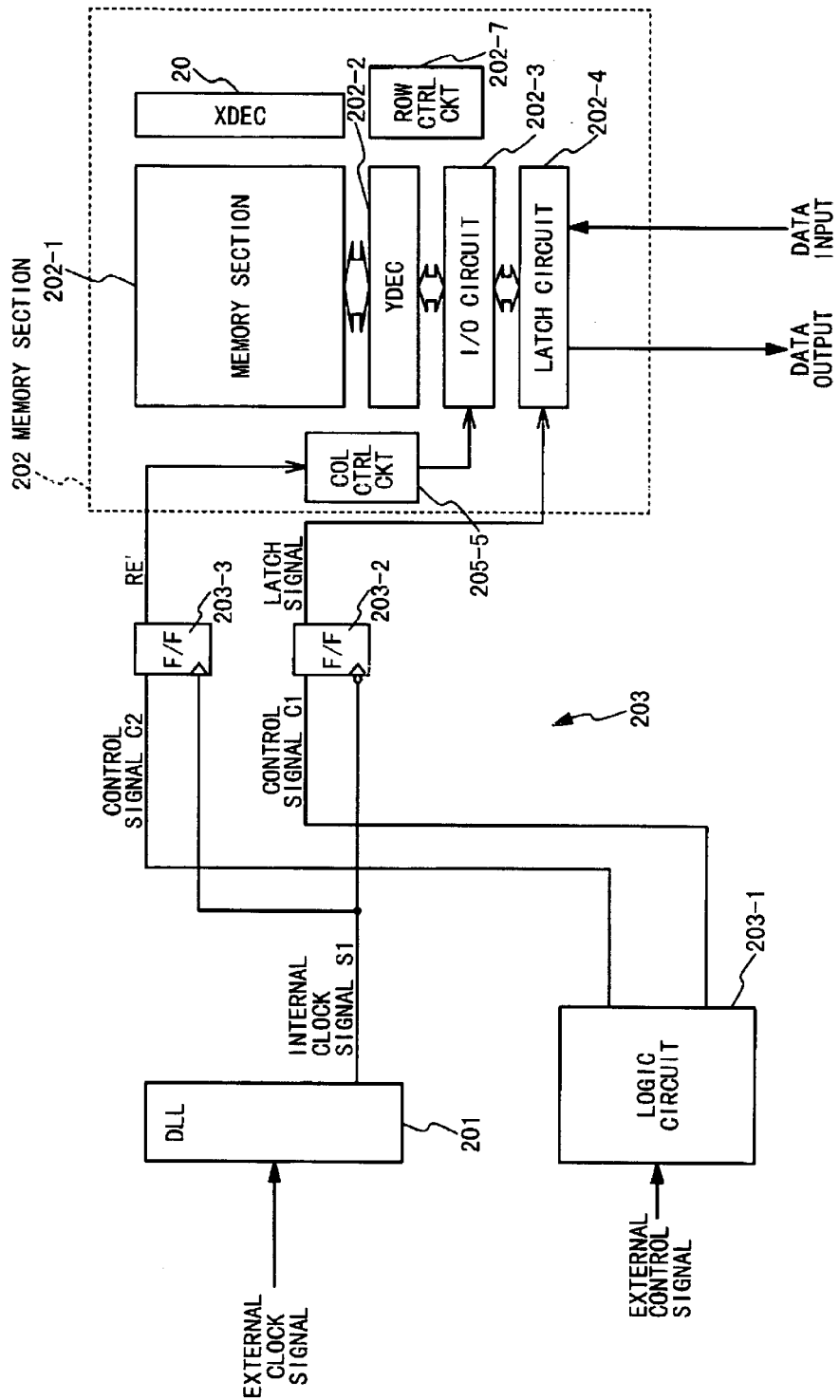
FIG. 1 is a block diagram showing the structure of a semiconductor device having a conventional DLL circuit.
Figure 2:
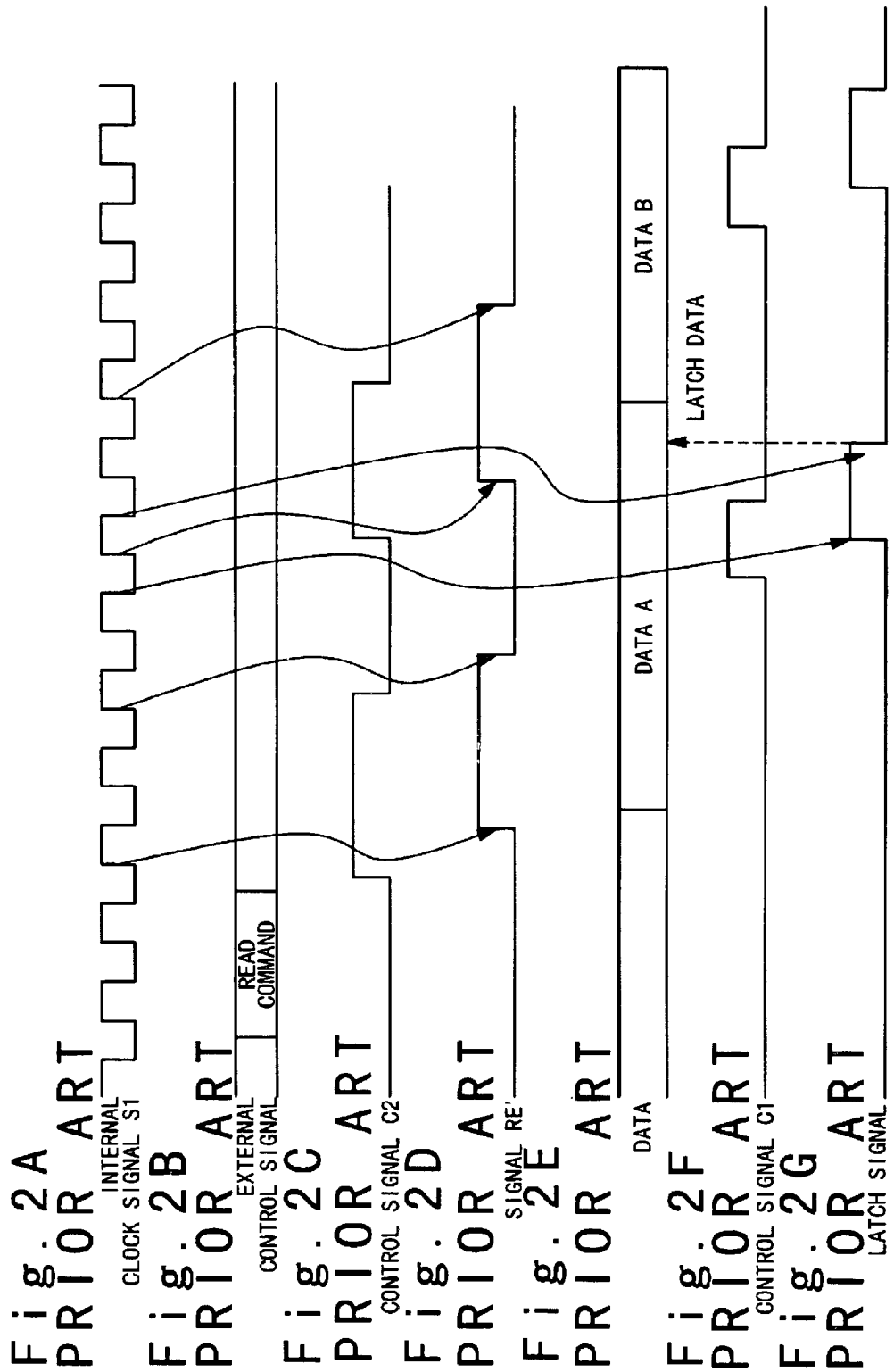
FIGS. 2A to 2G are timing charts showing the operation of the semiconductor device of FIG. 1.
Figure 3:
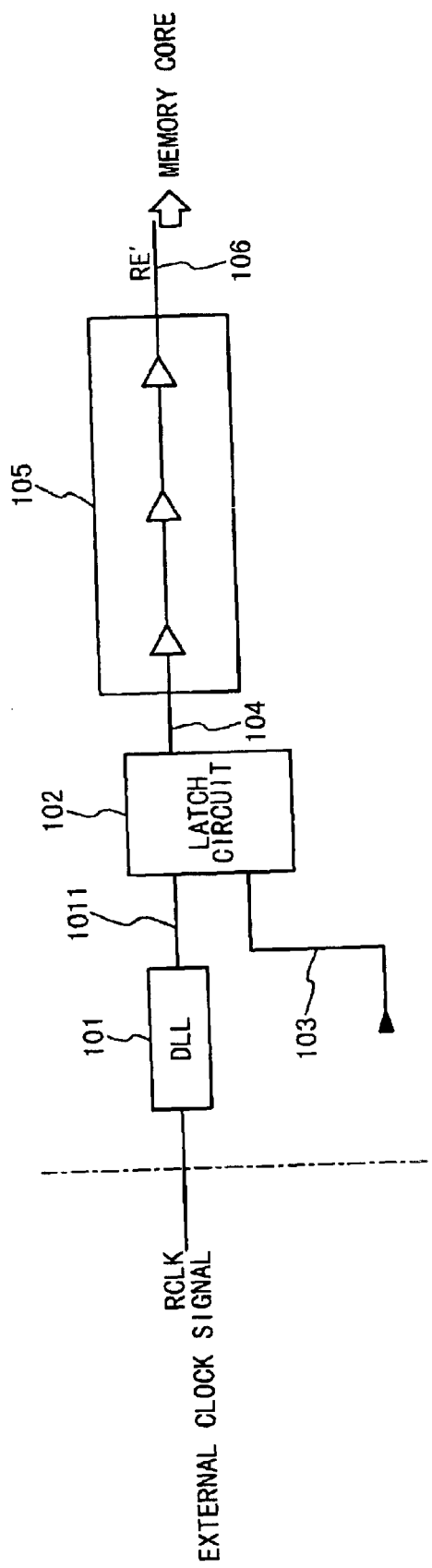
FIG. 3 is a block diagram showing the structure of the semiconductor device having another conventional DLL circuit.
Figure 8A:
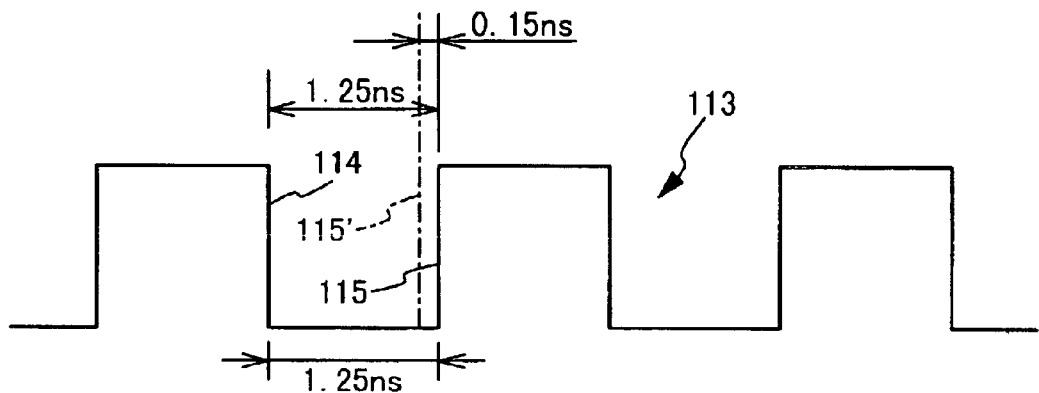
FIG. 8A is a desired waveform and FIGS. 8B and 8C are timing charts showing the change of the timing by deviation of the characteristic of the delay element.
Figure 8B:
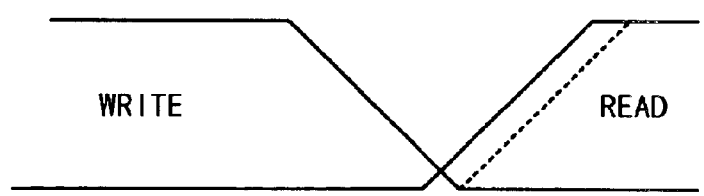
Figure 8C:
Figure 9:
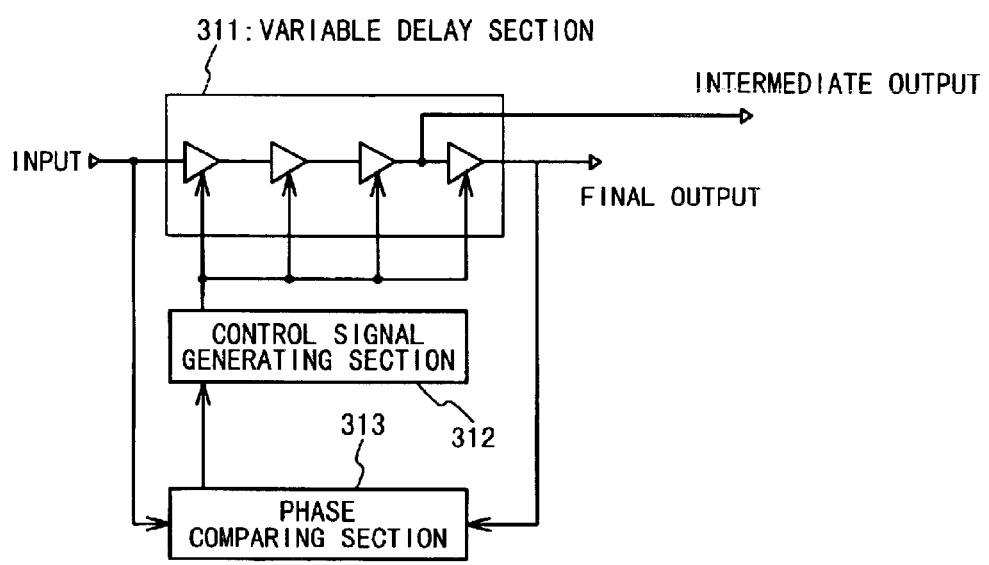
FIG. 9 is a block diagram showing the structure of the semiconductor device having another conventional DLL circuit.

As shown in FIG. 4B, the rising edge 35 of the internal clock signal S2 11-2 is earlier than the rising edge 36 of the internal clock signal S1 11-1, and the internal clock signal S2 11-2 is used to generate the read enable signal RE and the internal clock signal S1 11-1 is used to generate a signal which is equivalent to the signal 104 in the conventional example of FIG. 3. Therefore, the number of delay elements of the fixed delay section 9 may be few than the conventional delay circuit 105. As a result, the delay elements are difficult to undergo influence of deviation in the manufacturing process. Also, the semiconductor device having the DLL circuit of the present invention can be formed in a small size. It should be noted that the internal clock signal S2 11-2 is taken out from the DLL circuit 1 and does not depend on the frequency. The internal clock signal S2 11-2 has a load lighter than the internal clock signal S1 11-1 as the final output of the DLL circuit 1.

As described above, according to the DLL circuit of the present invention and the semiconductor device using it, a phase preceding signal can be generated without dependence on the frequency of the basic signal. Thus, the timing of the phase leading signal can be strictly adjusted. The timing is not influenced by a manufacturing process, and has a strict small phase difference. The DLL circuit of the present invention can help the high speed operation of the semiconductor device such as the synchronous type DRAM in which the strict timing precision is required, and allow the continuous operation of a write operation and a read operation.

Also, in the present invention, the delay circuit is not required to have many stages for generation of the phase preceding signal. Therefore, in the semiconductor device having the DLL circuit of the present invention, the increase of the circuit size can be suppressed.

What is claimed is:

1. A DLL (delay locked loop) circuit, comprising:
a delay circuit which is connected to first and second nodes, and which delays an original clock signal supplied to said first node based on a delay control signal and generates first to n-th (n is an integer more than 1) internal clock signals, wherein said first internal clock signal is outputted from said second node, and the internal clock signals other than said first internal clock signal are outputted from said delay circuit without passing through said second node, and lead the first internal clock signal in phase by a predetermined value, and wherein said original clock signal is a frequency variable clock signal and said delay circuit includes a first delay section with a frequency dependent delay time based on said frequency variable clock signal and a second delay section with a fixed delay time independent of said frequency variable clock signal;
a phase comparing circuit which compares said original clock signal supplied from said first node and said first internal clock signal supplied from said second node, and outputs a phase difference of said original clock signal and said first internal clock signal;
a delay control circuit which outputs said delay control signal to said delay circuit based on the phase difference outputted from said phase comparing circuit; and
a logic circuit that generates a latch signal in synchronism with said first internal clock signal and generates an enable signal in synchronism with at least one of said internal clock signals other than said first internal clock signal.

2. The DLL circuit according to claim 1, wherein
said first delay section delays said original clock signal based on said delay control signal to generate a first delay signal; and
said second delay section which is provided between said second node and said first delay section, and delays the first delay signal to generate said first to n-th internal clock signals, and outputs said first internal clock signal from said second node, and the internal clock signals other than said first internal clock signal without passing through said second node.

3. The DLL circuit according to claim 2, wherein said second delay circuit comprises:
a plurality of delay elements connected in series, and said first to n-th internal clock signals are outputted from different ones of said plurality of delay elements.

4. The DLL circuit according to claim 3, wherein each of said plurality of delay elements delays said first delay signal by substantially a same amount of time.

5. The DLL circuit according to claim 3, wherein each of said plurality of delay elements delays said first delay signal by an amount of time different from other delay elements.

6. The DLL circuit according to claim 3, wherein an amount of time by which each of said plurality of delay elements delays said first delay signal is predetermined.

7. The DLL circuit according to claim 3, wherein an amount of time by which each of said plurality of delay elements delays said first delay signal is independent of a frequency of said original clock signal.

8. The DLL circuit according to claim 3, wherein each of said plurality of delay elements is one of an inverter and a buffer.

9. The DLL circuit according to claim 3, wherein the number of delay elements is n.

10. A method of generating timing signals, comprising the steps of:
(a) delaying an original clock signal supplied to a first node based on a delay control signal;
(b) generating first to n-th (n is an integer more than 1) internal clock signals from the delayed original clock signal, wherein said first internal clock signal is outputted from a second node, and the internal clock signals other than said first internal clock signal are outputted without passing through the second node, and lead said first internal clock signal in phase by a predetermined value, and wherein the original clock signal is a frequency variable clock signal, and a first delay section with a frequency dependent delay time based on said frequency variable clock signal and a second delay section with a fixed delay time independent of said frequency variable clock signal control delay of the original clock signal and the internal clock signals;
(c) detecting a phase difference between said original clock signal and said first internal clock signal; and
(d) generating said delay control signal based on the detected phase difference, generating a latch signal in synchronism with said first internal clock signal, and generating an enable signal in synchronism with at least one of said internal clock signals other than said first internal clock signal.

11. The method according to claim 10, wherein the (a) delaying step comprises the steps of:
(e) delaying said original clock signal based on said delay control signal to generate a first delay signal; and
(f) delaying the first delay signal to generate said first to n-th internal clock signals.

12. The method according to claim 11, wherein the (f) delaying step comprises the step of:
(g) delaying the first delay signal by a plurality of delay elements connected in series, wherein said first to n-th internal clock signals are outputted from different ones of said plurality of delay elements.

13. The method according to claim 12, wherein each of said plurality of delay elements delays said first delay signal by substantially a same amount of time.

14. The method according to claim 12, wherein each of said plurality of delay elements delays said first delay signal by an amount of time different from other delay elements.

15. The method according to claim 12, wherein an amount of time by which each of said plurality of delay elements delays said first delay signal is predetermined.

16. The method according to claim 12, wherein an amount of time by which each of said plurality of delay elements delays said first delay signal is independent of a frequency of said original clock signal.

17. A synchronous memory, comprising:
a delay locked loop circuit that delays an original clock signal supplied as an input, said delay locked loop circuit producing as an output a plurality of internal clock signals, a first of said plurality of internal clock signals being said original clock signal delayed by a first quantity and a second of said plurality of internal clock signals being said original clock signal delayed by a second quantity different than said first quantity, said delay locked loop circuit comprising:
a variable delay section with a frequency dependent delay time that delays said original clock signal generated as a first delay signal based on a phase difference between said original clock signal and one of said plurality of internal clock signals; and a fixed delay section that is a multi-stage structure of delay elements that delays said first delay signal by a predetermined amount, said second internal clock signal being generated as an output of one of said stages;

a logic circuit that generates an enable signal in synchronism with said second internal clock signal and a latch signal in synchronism with said first internal clock signal; and a memory section that performs one of a read and write operation of data in response to said enable signal and latches said data for one of input and output to said memory section in response to said latch signal.

* * * * *